United States Patent
Suzuki et al.

(10) Patent No.: US 6,448,178 B1
(45) Date of Patent: Sep. 10, 2002

(54) HEAT TREATING METHOD FOR THIN FILM AND FORMING METHOD FOR THIN FILM

(75) Inventors: Kenji Suzuki, Yamanashi-Ken; Masahiko Matsudo, Kofu, both of (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 09/701,024

(22) PCT Filed: Mar. 17, 2000

(86) PCT No.: PCT/JP00/01665

§ 371 (c)(1),
(2), (4) Date: Nov. 22, 2000

(87) PCT Pub. No.: WO00/57463

PCT Pub. Date: Sep. 28, 2000

(30) Foreign Application Priority Data

Mar. 24, 1999 (JP) ............................................. 11-079068

(51) Int. Cl.$^7$ ................................................ C23C 16/22
(52) U.S. Cl. .................... 438/655; 438/660; 438/685; 438/770; 427/255.27; 427/255.4; 427/372.2
(58) Field of Search .................... 427/255.27, 255.4, 427/372.2; 438/655, 660, 683, 770

(56) References Cited

U.S. PATENT DOCUMENTS 5,946,579 A * 8/1999 Fulford et al. .............. 438/303

FOREIGN PATENT DOCUMENTS

| JP | 58-162062 | * | 9/1983 |
| JP | 4-207034 | | 7/1992 |
| JP | 4-266031 | | 9/1992 |
| JP | 6-37108 | | 2/1994 |
| JP | 7-193060 | | 7/1995 |
| JP | 7-221113 | | 8/1995 |
| JP | 8-88198 | | 4/1996 |
| JP | 10-242076 | | 9/1998 |

* cited by examiner

Primary Examiner—Timothy Meeks
(74) Attorney, Agent, or Firm—Smith, Gambrell & Russell, LLP

(57) ABSTRACT

A heat treatment method for heat treating a thin film is a method for heat treating the thin film having a metallic silicide layer, comprising a heating step, a temperature keeping step and a cooling step. Among these steps, the thin film is heated in an atmosphere of gas which is oxidizing gas or includes oxidizing gas at least in the heating step. An oxide film is formed on the thin film in the heating step to prevent the phosphorous atoms from escaping.

18 Claims, 3 Drawing Sheets

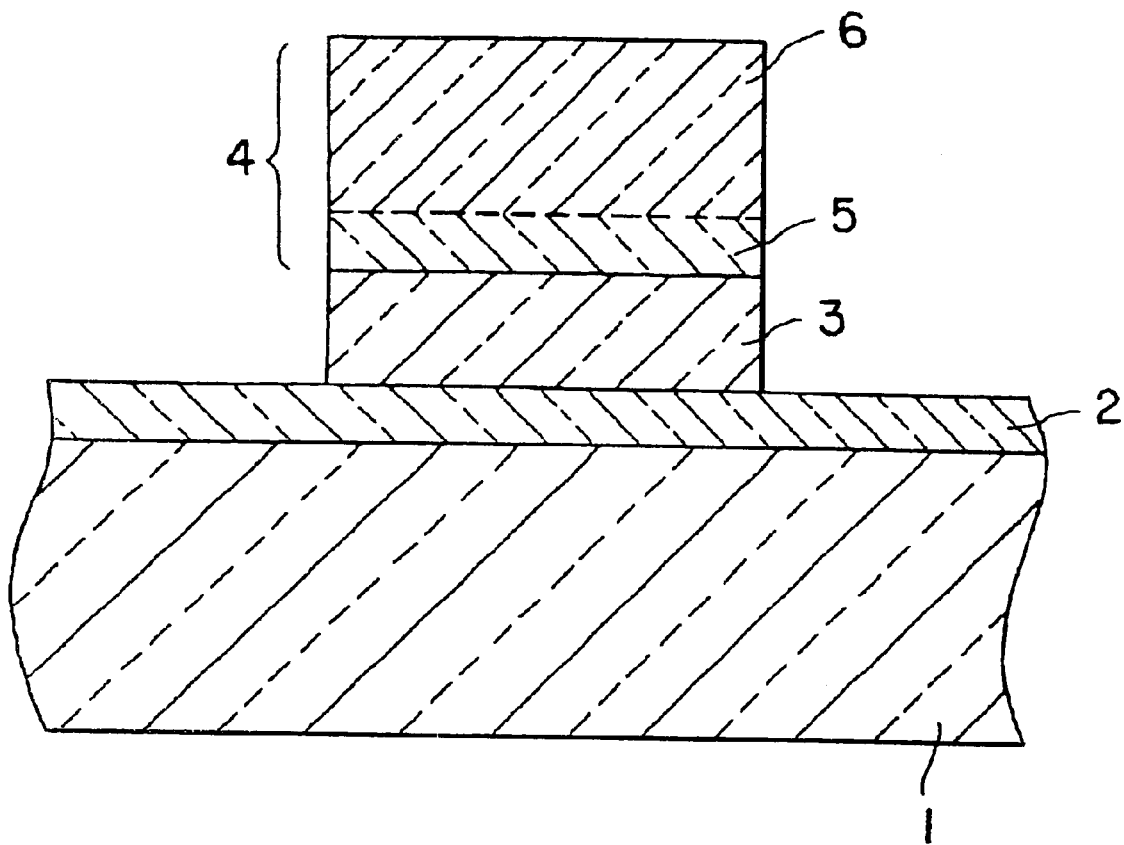
F I G. 1

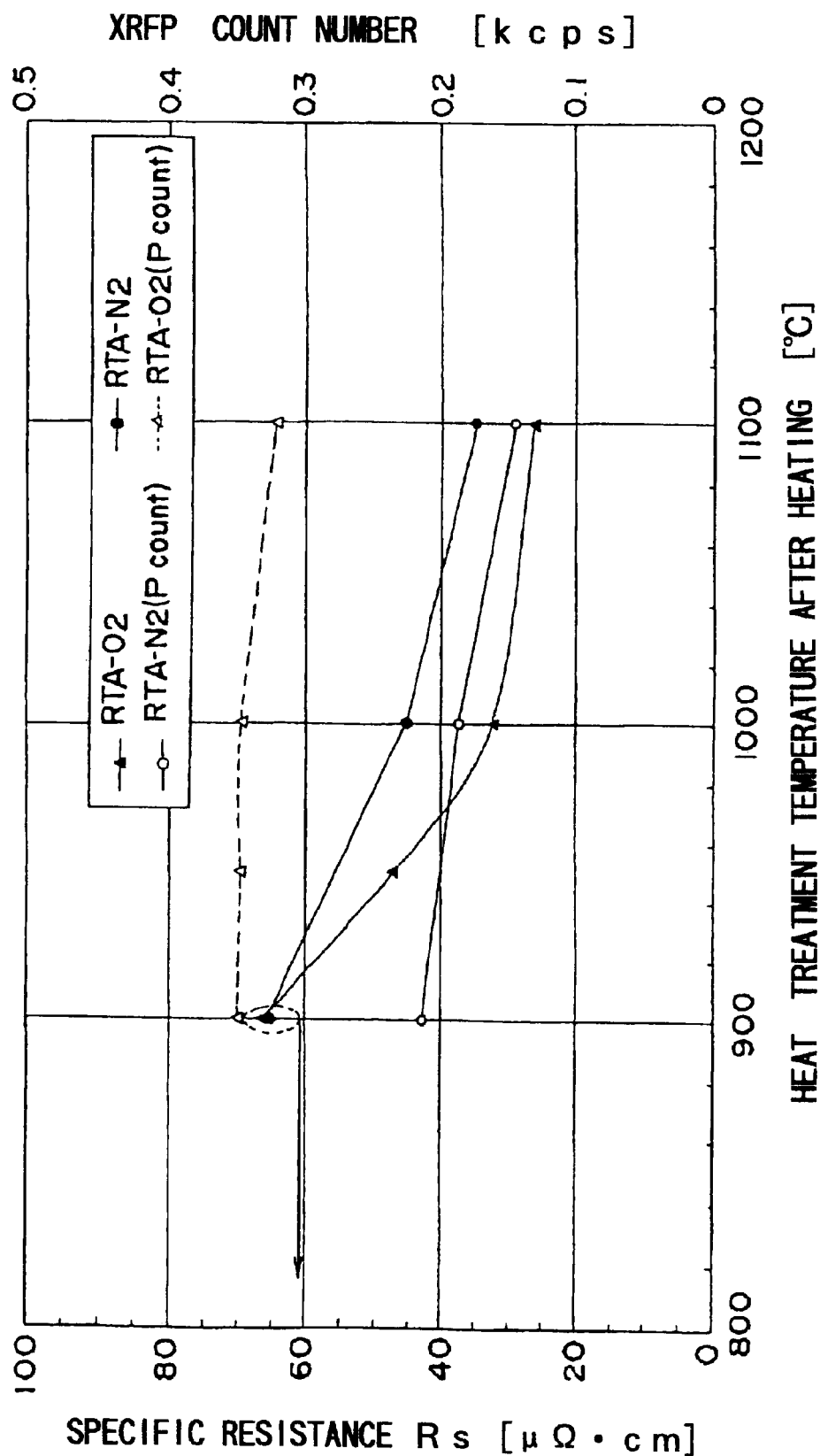
F I G. 2

HEAT TREATING METHOD FOR THIN FILM AND FORMING METHOD FOR THIN FILM

TECHNICAL FIELD

The present invention relates to a heat treatment method for heat treating and depositing a thin film used for a gate electrode and wiring of a semi-conductor device.

BACKGROUND OF THE INVENTION

In a semi-conductor device such as an LSI, a polycide layer having a polysilicon layer and a tungsten silicide layer given low resistance by doping impurities such as, for example, phosphorous, is widely used as a material for a gate electrode and wiring in order to lower resistance of the gate electrode and the wiring. The tungsten silicide layer as an upper layer of polycide structure is generally deposited by a CVD method using $WF_6/SiCl_2H_2/Ar$ as reactive gas. Thus when the tungsten silicide layer is deposited on the polysilicon layer, a deposition temperature, a reactive gas pressure, a gas flow rate, a gas flow rate ratio and so on are controlled to obtain required thin film properties of the tungsten silicide layer.

Since recent rapid development of microprocessing technology results in a requirement for further reducing the resistance of the gate electrode and the wiring, it has been tried so far to reduce the resistance of the tungsten silicide thin film by applying various conditions of the reactive gas ($WF_6/SiCl_2H_2/Ar$). However if only an adjustment of compositions of the thin film by changing the conditions of the reactive gas is performed, the reduction of the resistance of the thin film encounters a limitation. Therefore it is difficult to reduce the resistance by the conventional method corresponding to the microprocessing and thin film thickness reduction that will further progress.

DISCLOSURE OF THE INVENTION

The present invention is to solve the above-mentioned problems and has an object to provide a heat treatment method for heat treating and depositing a thin film that ensures to realize lowering of resistance of the thin film and enables to correspond to the lowering of the resistance that will further progress from now on.

This invention is the heat treatment method for heat treating a thin film including a metallic silicide layer containing an element of Group V of the Periodic table comprising a heating step to heat the thin film to a predetermined temperature, a keeping step to keep the thin film at the predetermined temperature and a cooling step to cool the thin film from the predetermined temperature, wherein the thin film is heated in an atmosphere of gas which is oxidizing gas or contains oxidizing gas at least in the heating step.

The present invention is the heat treatment method for heating the thin film, wherein the thin film is provided on a silicon substrate.

The present invention is the heat treatment method for heating the thin film, wherein the thin film further has a polysilicon layer provided on the silicon substrate side and containing an element of Group V of the Periodic table.

The present invention is the heat treatment method for heating the thin film, wherein the thin film is kept and cooled in an inert gas atmosphere in the temperature keeping step and the cooling step, respectively.

The present invention is the heat treatment method for heating the thin film, wherein the thin film has a metallic silicide layer containing phosphorous atoms.

The present invention is the heat treatment method, wherein the oxidizing gas is oxygen gas and the gas containing the oxidizing gas is mixed gas comprising oxygen gas and inert gas.

The present invention is the heat treatment method for heating the thin film, wherein the thin film is heated to a temperature of 950° C. to 1100° C. in the heating step.

The present invention is a deposition method for depositing a thin film having a metallic silicide layer containing an element of Group V of the Periodic table comprising a step to depositing a thin film having the metallic silicide layer containing an element of Group V of the Periodic table, the heating step to heat the thin film to the predetermined temperature, the temperature keeping step to keep the thin film at the predetermined temperature and the cooling step to cool the thin film from the predetermined temperature, wherein the thin film is heated in an atmosphere of gas which is oxidizing gas or contains oxidizing gas at least in the heating step.

The present invention is the deposition method for depositing the thin film, wherein the thin film is provided on the silicon substrate.

The present invention is the deposition method for depositing the thin film, wherein the thin film further has the polysilicon layer provided on the silicon substrate side and containing an element of Group V of the Periodic table.

The present invention is the deposition method for depositing the thin film, wherein the thin film is kept at the predetermined temperature and cooled in the inert gas atmosphere in the temperature keeping step and the cooling step, respectively.

The present invention is the deposition method for depositing the thin film, wherein the metallic silicide layer of the thin film includes phosphorous atoms.

The present invention is the deposition method for depositing the thin film, wherein the oxidizing gas is oxygen gas, and the gas including oxidizing gas is the mixed gas comprising oxygen gas and inert gas.

The present invention is the deposition method for depositing the thin film, wherein the thin film is heated to a temperature of 950° C. to 1100° C. in the heating step.

We studied a conventional heat treatment method in various ways in order to solve a problem that a film deposition step provides a limitation to the lowering the resistance of the film. As a result we reached a conclusion that inert gas such as nitrogen gas which is used for adjusting properties of the thin film in the conventional heat treatment method is the cause of providing the limitation to the lowering the resistance. In other words, since the heat treatment of the thin film is performed in the inert gas atmosphere, one of the causes is considered to be a phenomenon that impurities such as the phosphorous atoms contained in the thin film and contributing to the lowering the resistance thermally disperse in the thin film during the heat treatment and escape from the thin film, and an effect of reducing the resistance by adding the impurities that should have been essentially obtained during the film deposition is obstructed. Thus we obtained information that we can prevent the impurities such as the phosphorous atoms from escaping from the thin film by performing the heat treatment of the thin film in a specified gas atmosphere, and realize the further lowering of the resistance of the thin film.

The thin film to be subjected to the heat treatment in the present invention is one having the metallic silicide layer containing an element of Group V of the Periodic table. The resistance of the metallic silicide layer was reduced by adding the element of Group V of the Periodic table, and it has been so far deposited in a known method. The elements of Group V of the Periodic table including phosphorous, arsenic, antimony, and bismuth have been widely used so far as a dopant of the thin film. And the thin film in the present invention is that containing at least the metallic silicide layer. Therefore the thin film in the present invention may be one made from the metallic silicide layer only, or one made from the polysilicon layer overlaid by the metallic silicide layer. The metallic silicides include, for example, tungsten silicide, titanium silicide, cobalt silicide and molybdenum silicide.

The thin film to be subjected to the heat treatment in the present invention is one having a polysilicon layer and a metallic silicide layer containing the element of Group V of the Periodic table. The polysilicon layer and the metallic silicide layer of this thin film contain an element of Group V. Both of these layers can be continuously deposited by same deposition equipment, or the polysilicon layer and the metallic silicide layer can be individually deposited by different deposition equipment. In either deposition method, an addition of the element of Group V to the metallic silicide layer enables to appropriately control a grain size and orientation of crystal and to obtain the stable layer having low specific resistance (resistivity) and excellent migration resistance. For example the tungsten silicide layer is preferable as the metallic silicide layer, and the phosphorous atoms are preferable as an element of Group V to be added to the tungsten silicide layer. The deposition method of the tungsten silicide film containing the phosphorous atoms has been already proposed by the present Applicant in JP 10-262307.

The heat treatment of the present invention is performed in an oxidizing gas atmosphere or a gas atmosphere containing the oxidizing gas. The heat treatment step comprises the heating step to heat the thin film to the predetermined temperature (for example 950° C. to 1100° C.), the temperature keeping step to heat treat the thin film while keeping the heat treatment temperature after the heating and the subsequent cooling step, wherein the oxidizing gas or the gas containing the oxidizing gas is used at least in the heating step. The oxidizing gas comprises the oxygen gas, and the gas containing oxidizing gas comprises the inert gas such as nitrogen gas mixed with the oxidizing gas such as oxygen gas, and an oxide film is deposited on the thin film by the heat treatment of the thin film in the oxidizing gas atmosphere or the gas atmosphere containing the oxidizing gas. This oxide film can prevent the element of Group V such as phosphorous atoms from escaping from the thin film, and consequently realize the further lowering of the resistance. The heat treatment equipment used in the present invention is of a sheet-fed type (single type) using a halogen lamp or the like or of a batch type using a dispersion furnace such as an electric furnace. The single type of the heat treatment equipment is preferable considering a size enlargement of a semi-conductor wafer from now on.

The heat treatment method of the present invention uses the oxidizing gas or the gas containing the oxidizing gas at least in the heating step of the thin film. In the heating step, since the film is heated to the heat treatment temperature of, for example, around 1000° C., the oxide film is deposited on the thin film by using the oxidizing gas or the gas containing the oxidizing gas in the heating step before starting the temperature keeping step. Therefore the inert gas such as the nitrogen gas not containing oxidizing gas may be used in a step after the heating, namely in the temperature keeping step to keep the heat treatment temperature of, for example, around 1000° C. and the subsequent cooling step. Since a surface of the thin film is already protected by the oxide film in the heating step, escaping of the element of Group V such as phosphorous atoms can be prevented even if the inert gas such as the nitrogen gas is used in the step after the heating, and the further reduction of the resistance can be realized.

It is preferable to use the oxidizing gas or the gas containing the oxidizing gas only in the heating step and to use the inert gas such as the nitrogen gas in the step after the heating in the heat treatment method of the present invention. That is to say, it is preferable to use the inert gas such as nitrogen gas in the temperature keeping step and the cooling step after the heating. Particularly, in the sheet-fed type of the heat treatment, since the heat treatment is performed for a short time by RTA (Rapid Thermal Annealing), distribution of the specific resistance in a semi-conductor wafer becomes uneven, and variation of the specific resistance tends to become large. However, usage of the inert gas in the step after the heating can alleviate a disadvantage of RTA and drastically restrict the variation of the specific resistance of the entire surface of the semi-conductor wafer.

BRIEF DESCRIPTION OF THE DRAWINGS

FIG. 1 is a cross-sectional view illustrating an enlarged thin film used in the present invention.

FIG. 2 is a chart illustrating a relation between a heat treatment temperature and a specific resistance (resistivity) and a relationship between the heat treatment temperature and a counted number of phosphorous atoms contained in a tungsten layer.

PREFERRED EMBODIMENTS OF THE INVENTION

Figure 3:
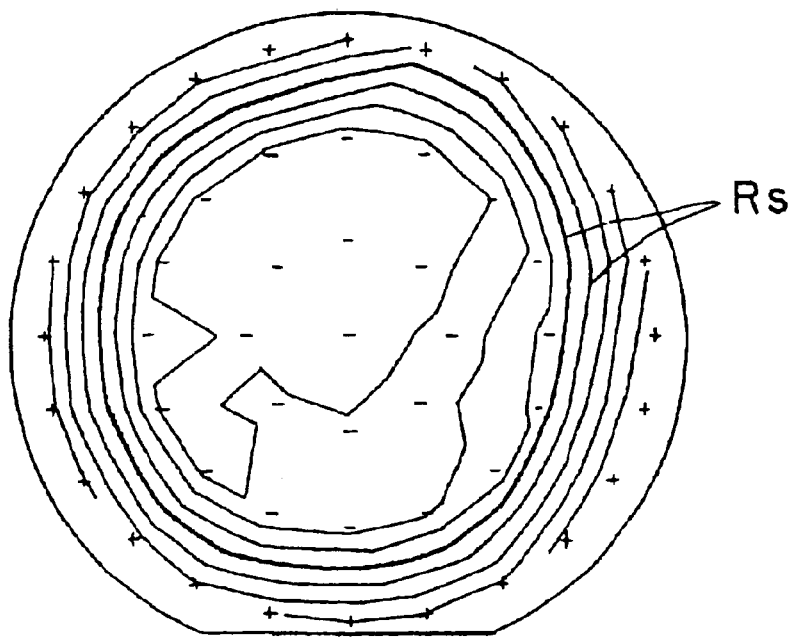
FIG. 3 is a distribution view of a specific resistance in a semi-conductor wafer when oxygen gas is used in a heating step of the heat treatment and nitrogen gas in a step after the heating.

Now embodiments of the present invention are described referring to FIG. 1 through FIG. 4.

FIG. 1 is a cross-sectional view illustrating an enlarged gate portion of a semi-conductor device that is a thin film to be subjected to a heat treatment method of the present invention. As shown in FIG. 1, for example a silicon oxide film 2 as a gate insulation film having a thickness of approximately 100 Å is deposited, for example, on a silicon substrate 1. A polysilicon layer 3 containing phosphorous atoms having a thickness of approximately 1000 Å is deposited on this silicon oxidized film 3. Further a tungsten silicide layer (a metallic silicide layer) 4 is deposited on the polysilicon layer 3.

This tungsten silicide layer (metallic silicide layer) 4 has two layers, namely an upper layer 5 and a lower layer 6, as shown in FIG. 1. The lower layer 5 is one to provide a growth core (nucleation) for depositing the upper layer 6, and made of the tungsten silicide containing comparatively rich silicon. The thickness of the upper layer 6 is comprised of almost all thickness of the tungsten silicide. The upper layer is made of a layer containing rich tungsten. The lower layer 5 is, for example, approximately 200 Å thick, the upper layer 6 is, for example, approximately 1000 Å thick, and the total layers are approximately 1200 Å thick.

A thin film (polycide layer) comprises the polysilicon layer 3 and the tungsten silicide layer 4.

The tungsten silicide layer 4 of the above-mentioned thin film can be deposited in two steps, for example, each being for the lower layer 5 and the upper layer 6 as shown below. A method for depositing the thin film is as follows. In a first stage, reactive gas including phosphine gas ($WF_6$/$SiCl_2H_2$/Ar/$PH_3$/Ar (Back side gas)=1 sccm/300 sccm/100 sccm/60 sccm/100 sccm (As for $PH_3$, a flow rate of liquid diluted to 1% concentration is shown. This applies also to the following embodiments.)) is supplied into a chamber, and a deposition process is performed on the polysilicon layer 3 of a semi-conductor wafer for approximately 50 seconds to obtain the lower layer 5 approximately 200 Å thick under a condition that a susceptor inside the chamber is at a temperature of approximately 625° C. and gas inside the chamber is at a pressure of approximately 4.5 Torr. In this case, concentration of the phosphine gas is approximately 0.11 vol. %.

Then the upper layer 6 is formed by continuous deposition. In this second step, the reactive gas including phosphine gas ($WF_6$/$SiCl_2H_2$/Ar/$PH_3$/Ar (Back side gas)=5 sccm/50 sccm/350 sccm/10 sccm/100 sccm) is supplied into the chamber, and a deposition process is performed for approximately 40 seconds to obtain the upper layer 6 approximately 1000 Å thick under a condition that the susceptor is at a temperature of approximately 625° C. and gas inside the chamber is at a pressure of approximately 4.5 Torr. In this embodiment, an amount of the phosphine gas added was smaller in a second step for depositing the upper layer 6 in comparison with a first step for depositing the lower layer 5. In this case, concentration of the phosphine gas is approximately 0.02 vol. %.

In this embodiment, the heat treatment RTA (Rapid Thermal Annealing) of the thin film deposited as described above is performed in different gas atmospheres and temperature profiles shown in Table 1. One is performed in an oxide gas atmosphere in the whole steps from the heating start through the cooling end, and the other is performed in a nitrogen gas atmosphere in the whole steps from the heating start through the cooling end. Further a few variations are performed by keeping temperatures between 900° C. and 1000 after the heating.

TABLE 1

| Step No. | Content | Time (sec) | Temperature (° C.) | Gas flow rate(L/sec) |
| --- | --- | --- | --- | --- |
| 1 | Gas substitution | 120 | 0 | 3 |
| 2 | Heating (Approx. 50° C./sec) | Approx. 20 | — | 3 |
| 3 | Keeping temperature | 30 | 90–1100 | 3 |
| 4 | Cooling | 90–120 | — | 3 |
| 5 | Gas substitution | 90 | 0 | 3 |

Results of RTA performed in each of the above conditions of Table 1 are shown in FIG. 2. FIG. 2 is a chart showing relations between a heat treatment temperature and specific resistance (resistivity) Rs of the thin film (polycide layer) comprising the polysilicon layer 3 and the tungsten silicide layer 4, and between the heat treatment temperature and a count number of phosphorous atoms contained in the tungsten silicide layer 4. In addition, the count number of the phosphorous atoms is obtained by X-ray fluorescence analysis (XRF).

According to the results shown in FIG. 2, in case of the heat treatment temperature at 1000° C., the specific resistance Rs is low in both cases that the heat treatment is performed in the oxygen gas atmosphere in the whole steps from the heating to cooling and in the nitrogen gas in the whole steps from the heating to cooling. It is found that the specific resistance Rs of the former is 32.6 $\mu\Omega$·cm and that of the latter is 45 $\mu\Omega$·cm, namely the specific resistance Rs of the former is smaller than that of the latter by approximately 30%. Further, in case of the heat treatment temperature at 1100° C., it is found that the specific resistance Rs of the former is 25 $\mu\Omega$·cm and that of the latter is 35 $\mu\Omega$·cm, namely the specific resistance Rs of the former is smaller than that of the latter by approximately 30%. On the other hand, as shown in FIG. 2, a reduction of the count number of the phosphorous atoms from that of 900° C. was not so high in both the former and the latter even if the heat treatment temperature rises from 900° C. to 1100° C. An effect of the reduction of the specific resistance Rs is recognized in the heat treatment at temperatures between 950° C. and 1100° C. The effect at the temperature between 1000° C. and 1100° C. is significant.

Now the reduction of the specific resistance by the heat treatment is described. As mentioned above, crystal structure of the tungsten silicide layer 4 contained in the thin film changes in the heat treatment comprising the heating step, the temperature keeping step and the cooling step, which results in the reduction of the specific resistance Rs.

An oxide film is formed on a surface of the tungsten silicide 4 by performing the heating step of the heat treatment at least in the oxygen gas atmosphere. The oxide film can prevent the phosphorous atoms from escaping so that the specific resistance Rs can be reduced.

In this embodiment, RTA is performed in different conditions of oxygen gas supply to observe an effect of the oxygen gas on the specific resistance in each step of RTA. First the heating step of RTA was performed while supplying the oxygen gas in the condition shown in Table 1. Just after the temperature reached 1000° C., the oxygen gas is substituted with nitrogen gas. Then the temperature keeping step and the cooling step were performed while the nitrogen gas is supplied. A result is shown in FIG. 3. In the result shown in FIG. 3, it is found that a width between contour lines of the specific resistance Rs in a plane of the semi-conductor wafer is large, and uniformity in the plane is 3.18%, namely the specific resistance Rs is equalized. Thick lines show the contour lines of average values of the specific resistance Rs in FIG. 3 and FIG. 4.

Figure 4:
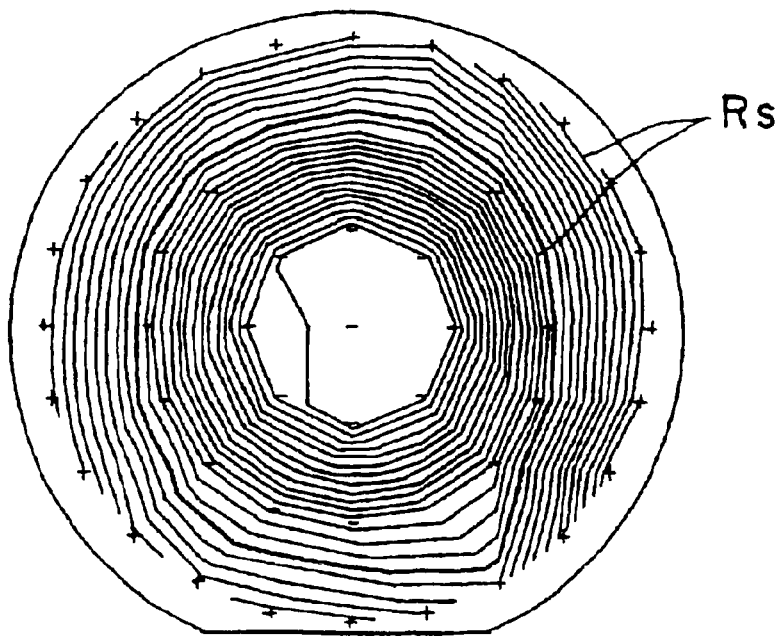
FIG. 4 is a distribution view of a specific resistance in a semi-conductor wafer when oxygen gas is used in the heating step of the heat treatment and in the subsequent entire steps.

Then RTA is performed while supplying the oxygen gas in the whole steps of RTA(heating step to 1000° C., the heat treatment step and the cooling step) in the condition shown in Table 1. A result is shown in FIG. 4. In the result shown in FIG. 4, it is found that the width between the contour lines of the specific resistance Rs in the plane of the semi-conductor wafer is small, and the uniformity in the plane is lower than that shown in FIG. 3. The uniformity in this case was 9.25%.

Therefore it is found that supply of the oxidizing gas only in the heating step of the RTA heat treatment can realize the reduction of the resistance and the uniformity of the specific resistance Rs in the plane of the semi-conductor wafer.

In addition, although only the heat treatment of RTA was described in the above embodiment, the heat treatment method of the present invention can apply to the heat treatment using the batch type of the heat treatment equipment. Although the oxygen gas was used as the oxidizing gas in the above embodiment, any other gases such as a steam that can create an atmosphere to deposit the oxide film on the surface of the thin film can be used without limitation. Further the gas containing the oxidizing gas may be mixed gas of the nitrogen gas and the oxygen gas, and mixing ratio of the nitrogen gas and the oxygen gas is, for example, 90:10, 80:20 and 70:30.

As described above, the present invention can increasingly realize the reduction of the resistance of the thin film and can obtain the thin film that can deal with the further reduction of the resistance.

What is claimed is:

1. A heat treatment method for heat treating a thin film that is provided on a substrate and includes a metallic silicide layer containing an element of Group V of the periodic table, said method comprising the steps of:

heating the thin film to a predetermined temperature;

maintaining the thin film at the predetermined temperature, and cooling the thin film from the predetermined temperature, wherein the thin film is heated in an atmosphere of gas which is oxidizing gas or includes oxidizing gas in the heating step, and the thin film is kept in an atmosphere consisting essentially of inert gas during the maintaining step and the cooling step.

2. The heat treatment method for heat treating a thin film according to claim 1, wherein the thin film is provided on a silicon substrate.

3. The heat treatment method for heat treating a thin film according to claim 2, wherein the thin film further includes a polysilicon layer provided on the silicon substrate and containing an element of Group V of the Periodic table.

4. The heat treatment method for heat treating a thin film according to claim 1, wherein the element of group V of the Periodic table is one selected from the group consisting of phosphorous, arsenic, antimony, and bismuth.

5. The heat treatment method for heat treating a thin film according to claim 1, wherein the oxidizing gas is oxygen gas and the gas including the oxidizing gas is mixed gas of oxygen gas and nitrogen gas.

6. The heat treatment method for heat treating a thin film according to claim 1, wherein the thin film is kept at a temperature between 950° C. and 1100° C. in the maintaining step.

7. A thin film deposition method for depositing on a substrate a thin film including a metallic silicide containing an element of Group V of the Periodic table, comprising the steps of:

depositing on the substrate a thin film including the metallic silicide using a reactive gas consisting of a gas including a metal, a gas including the element of Group V of the Periodic table, and a gas including silicon, heating the thin film to a predetermined temperature;

maintaining the thin film at the predetermined temperature, and cooling the thin film from the predetermined temperature, wherein the thin film is heated in an atmosphere of gas which is oxidizing gas or includes oxidizing gas in the heating step and the thin film is kept in an atmosphere consisting essentially of inert gas during the maintaining step and the cooling step.

8. The thin film deposition method according to claim 7, wherein the thin film is provided on a silicon substrate.

9. The thin film deposition method according to claim 7, wherein the thin film further includes a polysilicon layer provided on the silicon substrate and containing an element of Group V of the Periodic table.

10. The thin film deposition method according to claim 7, wherein the element of group V of the Periodic table is one selected from the group consisting of phosphorous, arsenic, antimony, and bismuth.

11. The thin film deposition method according to claim 7, wherein the oxidizing gas is oxygen gas and the gas including the oxidizing gas is mixed gas of oxygen gas and nitrogen gas.

12. The thin film deposition method according to claim 7, wherein the thin film is kept at a temperature between 950° C. and 1100° C. in the maintaining step.

13. The thin film deposition method for heat treating a thin film according to claim 7, wherein the metallic silicide layer includes one selected from the group consisting of tungsten silicide, titanium silicide, cobalt silicide and molybdenum silicide.

14. The thin film deposition method for heat treating a thin film according to claim 7, wherein the metallic silicide layer is a tungsten silicide layer, the tungsten silicide layer having a first layer containing comparatively rich silicon and a second layer containing comparatively rich tungsten.

15. The thin film deposition method for heat treating a thin film according to claim 7, wherein the metallic silicide layer has a first layer deposited by using the reactive gas consisting of gas including the element of Group V of the Periodic table at a first concentration with respect to the whole reactive gas, and a second layer deposited by using the reactive gas consisting of the gas including the element of Group V of the Periodic table at a second concentration with respect to the whole reactive gas.

16. The thin film deposition method for heat treating a thin film according to claim 15, wherein the first concentration of the gas including the element of Group V of the Periodic table is higher than the second concentration of the gas including the element of Group V of the Periodic table.

17. The thin film deposition method for heat treating a thin film according to claim 7, wherein the gas including the metal is $WF_6$, the gas including silicon is $SiCl_2H_2$, and the gas including the element of Group V of the Periodic table is $PH_3$.

18. A method of forming a gate electrode on a semiconductor substrate, said method comprising:

forming a gate oxide film on the substrate, forming a polysilicon layer on the gate oxide film, depositing a metallic silicide using reactive gas consisting of gas including a metal, gas including an element of Group V of the Periodic table, and gas including silicon, and heat-treating the substrate, wherein the heat-treating step comprises:
heating the substrate to a predetermined temperature in an atmosphere of gas which is oxidizing gas or includes oxidizing gas;
maintaining the substrate at the predetermined temperature, and
cooling the substrate from the predetermined temperature, wherein
the substrate is kept in an atmosphere consisting essentially of inert gas during the maintaining and the cooling step.

* * * * *